(12) United States Patent
Ito et al.

(10) Patent No.: US 7,887,992 B2
(45) Date of Patent: Feb. 15, 2011

(54) PHOTOSENSITIVE PASTE AND PROCESS FOR PRODUCTION OF PATTERN USING THE SAME

(75) Inventors: Kazushige Ito, Kanagawa (JP); Hiroaki Noda, Tokyo (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 100 days.

(21) Appl. No.: 12/342,163

(22) Filed: Dec. 23, 2008

(65) Prior Publication Data

US 2010/0159391 A1 Jun. 24, 2010

(51) Int. Cl.
*G03F 7/00* (2006.01)
*G03F 7/004* (2006.01)
*G03F 7/40* (2006.01)

(52) U.S. Cl. ............... 430/270.1; 430/281.1; 430/286.1; 430/330; 430/331; 430/905; 430/913; 430/950

(58) Field of Classification Search ............... 430/270.1, 430/905, 281.1, 286.1, 330, 331, 913, 950
See application file for complete search history.

(56) References Cited

U.S. PATENT DOCUMENTS

| | | | |
|---|---|---|---|
| 2,850,445 A | 9/1958 | Oster | |
| 2,875,047 A | 2/1959 | Oster | |
| 3,074,974 A | 1/1963 | Gebura | |
| 3,097,097 A | 7/1963 | Oster et al. | |
| 3,145,104 A | 8/1964 | Oster et al. | |
| 3,380,381 A | 4/1968 | Musgrave | |
| 3,427,161 A | 2/1969 | Laridon et al. | |
| 3,479,185 A | 11/1969 | Chamberg, Jr. | |
| 3,549,367 A | 12/1970 | Chang et al. | |
| 4,162,162 A | 7/1979 | Dueber | |
| 5,032,490 A | 7/1991 | Nebe et al. | |
| 6,214,527 B1* | 4/2001 | Kosaka et al. ............... 430/319 |
| 6,312,864 B1 | 11/2001 | Tokai et al. | |
| 6,586,108 B1 | 7/2003 | Courtoy et al. | |
| 6,630,287 B2* | 10/2003 | Towata ............... 430/311 |
| 6,790,596 B2* | 9/2004 | Kubota et al. ............ 430/281.1 |
| 6,806,028 B2* | 10/2004 | Kubota ............ 430/270.1 |
| 6,885,276 B2* | 4/2005 | Iha et al. ............... 336/200 |
| 6,939,922 B2* | 9/2005 | Beckley et al. ............ 525/329.7 |
| 7,087,357 B2* | 8/2006 | Kubota ............ 430/270.1 |
| 7,442,488 B2* | 10/2008 | Lee et al. ............ 430/270.1 |
| 2006/0266984 A1 | 11/2006 | Lee et al. | |
| 2007/0225443 A1 | 9/2007 | Skelskey et al. | |
| 2010/0096972 A1 | 4/2010 | Shigeta et al. | |

FOREIGN PATENT DOCUMENTS

| | | |
|---|---|---|
| JP | 2004063247 | 2/2004 |
| JP | 2005215134 | 8/2005 |
| JP | 200839962 | 2/2008 |
| JP | 2008-189530 A | 8/2008 |
| WO | 03/032087 A2 | 4/2003 |
| WO | 2006/049049 A1 | 5/2006 |
| WO | 2008/096782 A1 | 8/2008 |

OTHER PUBLICATIONS

Technical Data Sheet SR415.
International Search Report for International Application No. PCT/US2009/069358 Dated Mar. 30, 2010.

* cited by examiner

*Primary Examiner*—Amanda C. Walke

(57) ABSTRACT

Disclosed is a photosensitive paste comprising a polymerizable monomer and a photopolymerization initiator, wherein the glass transition temperature of the polymerizable monomer is −10° C. or less. The present paste may be used for creating a fine pattern and prevents residue from remaining in the area where paste should be removed.

12 Claims, 2 Drawing Sheets

PHOTOSENSITIVE PASTE AND PROCESS FOR PRODUCTION OF PATTERN USING THE SAME

BACKGROUND OF THE INVENTION

1. Field of the Invention

The present invention relates to a photosensititve paste and to methods of using the paste for producing fine patterns.

2. Technical Background

Techniques involving the use of photosensitive pastes for forming fine patterns are known in the art. Photosensitive pastes generally include a polymerizable monomer and photopolymerization initiator. Depending on the intended application, photosensitive pastes may also include conductive particles, glass powder, organic binder, organic solvent, and other additives. The photosensitive paste is applied onto a substrate on which a pattern is to be formed, and the paste is exposed to light in the desired pattern. During the exposure process, polymerization progresses in the parts that have been irradiated with light, and the pattern is then formed in a subsequent development process. The pattern is then fired, and a pattern consisting of inorganic material is formed on the substrate. The pattern that has been formed functions as an electrode, conductor, wall, or the like.

Technical progress has been accompanied by demand for the formation of finer patterns. However, when attempts are made to form fine patterns, the patterns are sometimes not properly formed, causing increases in the rate of defects. When electrode patterns are formed, for example, adjacent patterns may not be adequately separated and can cause shorts, which can be a fatal flaw in the final product.

Techniques for forming fine patterns have been developed from a variety of perspectives. Examples include techniques for modifying the structure itself of the electronic device, techniques related to improving the light exposure method, techniques related to improving components in the paste, and so forth. JP2008-39962A, for example, disclosed a technique for forming a resistor layer using a photosensitive paste comprising glass powder, ruthenium oxide powder, and a photosensitive organic component, wherein the mass ratio between the glass powder and ruthenium oxide is 30:70 to 90:10, the central particle diameter of the glass powder is in the range from 0.5 to 5 µm, and the central particle diameter of the ruthenium oxide is in the range from 0.01 to 0.3 µm. JP2005-215134A disclosed a photosensitive inorganic paste composition comprising at least a photopolymerization initiator, photopolymerizable monomer, and inorganic powder, wherein a Norrish type I photopolymerization initiator and a hydrogen abstraction type of photopolymerization initiator are simultaneously included as the photopolymerization initiator. It would be desirable to develop an improved process for fine pattern generation that results in less residue remaining on the substrate and that avoids product defects.

SUMMARY OF THE INVENTION

One aspect of the present invention is a photosensitive paste, comprising a polymerizable monomer and a photopolymerization initiator, wherein the glass transition temperature of the polymerizable monomer is −10° C. or less.

Another aspect of the present invention is a process for production of pattern, comprising steps of applying a photosensitive paste comprising a polymerizable monomer and a photopolymerization initiator, the glass transition temperature of the polymerizable monomer being −10° C. or less; exposing the applied paste to light, which initiates the polymerization of the polymerizable monomer; developing the exposed paste, thereby forming a pattern; and sintering the pattern.

According to the present invention, a fine pattern with reduced residue and no final product defects can be formed.

DETAILED DESCRIPTION OF THE INVENTION

Figure 1:
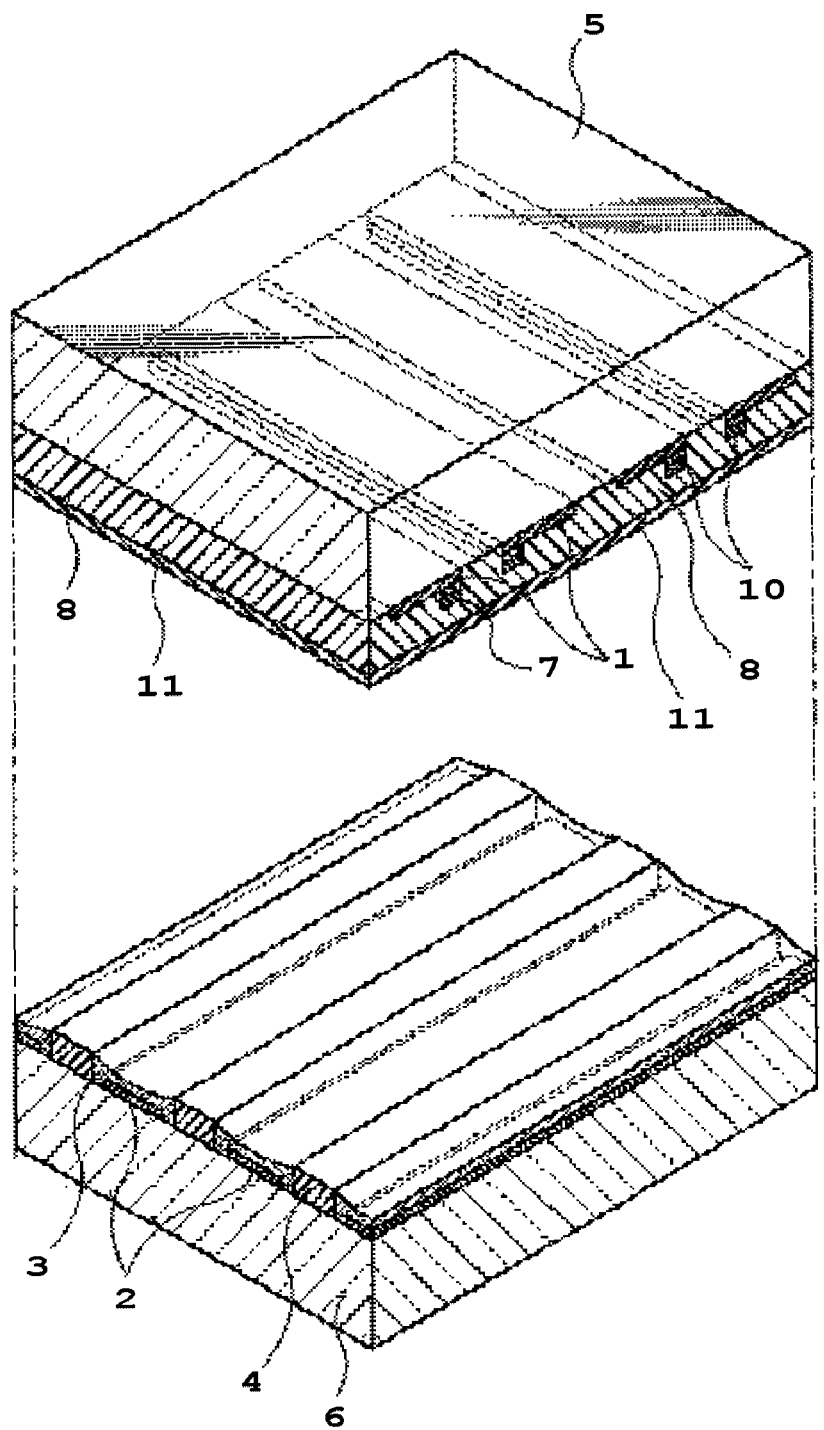
FIG. 1 is a perspective expansion plan schematically illustrating an AC plasma display panel device.

The present invention provides a paste that is used for forming a fine pattern with few defects. The inventors studied the tendency for residue to be left over in parts where paste is removed when finer patterns are produced. The residue is believed to be produced by the radiation of light onto parts which are not supposed to be irradiated during the exposure process. To prevent the root cause of residue production, the following three options are therefore possible: 1) improving the exposure process so that light is properly irradiated along the pattern shape; 2) improving the paste composition so that residue is less likely to be produced; and 3) improving the development process so that residue is completely eliminated during the development process.

The inventors aimed to prevent residue through improvements in the paste composition. As a result, it was found that, even though the photosensitive paste includes various components, such as glass powder, monomer, binder polymer, solvent, and conductive powder, residue can be prevented from being produced by controlling the monomer. When unnecessary polymerization results from even slight irradiation by light, the polymer that is formed tends to remain in the form of residue. A compound with a low glass transition temperature (Tg) can be used as the monomer component to minimize unnecessary polymerization of the monomer component and make it harder for residue to be produced despite irradiation with unintended light sources, such as scattered light.

Specifically, the first embodiment of the present invention relates to a photosensitive paste, comprising a polymerizable monomer and a photopolymerization initiator, wherein the glass transition temperature of the polymerizable monomer is −10° C. or less.

The constituents of the paste will first be described. The constituents are selected, depending on the application of the paste. For example, in case that the paste is used for producing electrode, conductive powder, glass powder (glass frit), polymeric binder, polymerizable monomer, photopolymerization initiator and solvent are typically included. In case that the paste is used for producing insulating pattern such as dielectric pattern, insulating pattern, insulating wall etc., glass powder, polymeric binder, polymerizable monomer, photopolymerization initiator and solvent are typical components. The content of each component can be chosen depending on the application, method of applying paste, and other factors.

(A) Photopolymerizable Monomer

A polymerizable monomer (photopolymerizable monomer) with a glass transition temperature of −10° C. or less ("low-Tg monomer") is included in the photosensitive paste of the present invention. The use of a low-Tg monomer will prevent the progress of unnecessary polymerization caused by irradiation with unintended light. The lower the glass transition temperature, the less likely residue will be produced. The upper limit of the glass transition temperature is preferably −10° C. or less, and more preferably −15° C. or less. Although the lower limit of the glass transition temperature is not particularly limited, a temperature no lower than −40° C. is usually used.

The glass transition temperature of the monomer can be measured using a commercially available differential thermal analyzer. When significant differences in measurement data occur between devices, the monomer glass transition temperature in the present application is defined as the glass transition temperature that is determined using a differential thermal analyzer DSC6220 by Shimadzu while the temperature is increased from −100° C. to 200° C. at a rate of 10° C./min.

Although the content of the low-Tg monomer is not particularly limited, the content is preferably 50 to 100 wt %, and more preferably 70 to 100 wt %, based on the total amount of polymerizable monomer contained in the paste. An amount of low-Tg monomer that is too low will compromise the effect of the invention in preventing residue. The maximum content of the low-Tg monomer is not limited, and the entire monomer in the paste may be a low-Tg monomer.

Examples of compounds that can be used as low-Tg monomer include compounds in which two or more acrylates, methacrylates, or propane acrylates are linked by an alkoxy group (—RO—); and compounds in which two or more acrylates, methacrylates, or propane acrylates are linked by a polyalkylene glycol. Two or more kinds of low-Tg monomer may be combined. In a preferred embodiment, the hydroxyl groups in the acrylates, methacrylates, or propane acrylates are linked to methylol (—CHOH) by an alkoxy group.

More specific examples include methoxylated trimethylol acrylate, ethoxylated trimethylol acrylate, propoxylated trimethylol acrylate, butoxylated trimethylol acrylate, methoxylated trimethylol methacrylate, ethoxylated trimethylol methacrylate, propoxylated trimethylol methacrylate, butoxylated trimethylol methacrylate, methoxylated trimethylol propane acrylate, ethoxylated trimethylol propane acrylate, propoxylated trimethylol propane acrylate, butoxylated trimethylol propane acrylate, methoxylated glyceryl triacrylate, ethoxylated glyceryl triacrylate, propoxylated glyceryl triacrylate, butoxylated glyceryl triacrylate, methoxylated bisphenol methacrylate, ethoxylated bisphenol methacrylate, propoxylated bisphenol methacrylate, butoxylated bisphenol methacrylate, polymethylene glycol dimethacrylate, polyethylene glycol dimethacrylate, polypropylene glycol dimethacrylate, polybutylene glycol dimethacrylate, methoxypolyethylene glycol monomethacrylate, ethoxypolyethylene glycol monomethacrylate, propoxypolyethylene glycol monomethacrylate, and butoxypolyethylene glycol monomethacrylate.

Although the amount in which the alkoxy groups are present is not particularly limited, 3 to 45 alkoxy groups are preferably introduced per compound, on average. Similarly, the amount in which the polyalkylene glycol is present is not particularly limited, but the alkylene repeating units included per compound is, on average, 200 to 600.

Ethoxylated (15) trimethylolpropane triacrylate, propoxylated (3) trimethylolpropane triacrylate, propoxylated (5) glyceryl triacrylate, ethoxylated (9) trimethylol propane acrylate, ethoxylated (3) trimethylol acrylate, polyethylene glycol (600) dimethacrylate, ethoxylated (30) bisphenol dimethacrylate, methoxypolyethylene glycol (350) monomethacrylate, and the like can be used, for example. The numerical figures in parentheses for the above compounds indicate the number of alkoxy groups present per molecule or the number of alkylene repeating units that are present.

The structural formula for propoxylated (3) trimethylolpropane triacrylate is given below for reference.

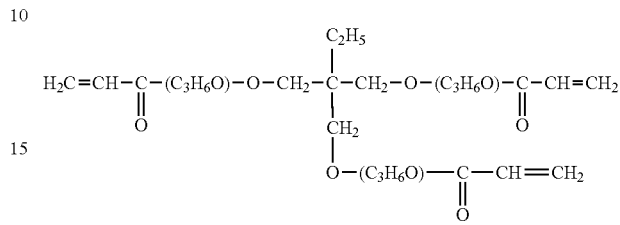

Normal monomers may also be used in combination with the low-Tg monomer. The monomers that can be used are not particularly limited.

Desirable monomers that can be used in combination with low-Tg monomer include t-butyl (meth)acrylate, 1,5-pentanediole di(meth)acrylate, N,N-dimethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylol propane di(meth)acrylate, glycerol di(meth)acrylate, tripropylene glycol di(meth)acrylate, glycerol tri(meth)acrylate, trimethylol propane tri(meth)acrylate, the compounds given in U.S. Pat. No. 3,380,381, the compounds disclosed in U.S. Pat. No. 5,032,490, 2,2-di(p-hydroxyphenyl)-propane di(meth)acrylate, pentaerythritol tetra(meth)acrylate, triethylene glycol diacrylate, polyoxyethyl-1,2-di-(p-hydroxyethyl)propane dimethacrylate, bisphenol A di-[3-(meth)acryloxy-2-hydroxypropyl)ether, bisphenol A di-[2-(meth)acryloxyethyl)ether, 1,4-butanediol di-(3-methacryloxy-2-hydroxypropyl)ether, triethylene glycol dimethacrylate, polyoxypropyl trimethylol propane triacrylate, trimethylol propane ethoxy triacrylate, butylene glycol di(meth)acrylate, 1,2,4-butanediol tri(meth)acrylate, 2,2,4-trimethyl-1,3-pentanediol di(meth)acrylate, 1-phenylethylene-1,2-dimethacrylate, diallyl fumarate, styrene, 1,4-benzenediol dimethacrylate, 1,4-diisopropenyl benzene, 1,3,5-triisopropenyl benzene, monohydroxypolycaprolactone monoacrylate, polyethylene glycol diacrylate, and polyethylene glycol dimethacrylate. Here, "(meth)acrylate" is an abbreviation indicating both acrylate and methacrylate. The above monomers may undergo modification such as polyoxyethylation or ethylation.

The content of the photopolymerizable monomer is preferred to be 2 to 20 wt %.

(B) Photopolymerization Initiator

Desirable photoinitiators will be thermally inactive but produce free radicals when exposed to actinic rays at a temperature of 185° C. or below. Examples include compounds having two intramolecular rings in a conjugated carbocyclic system. More specific examples of desirable photoinitiators include 9,10-anthraquinone, 2-methyl anthraquinone, 2-ethyl anthraquinone, 2-t-butyl anthraquinone, octamethyl anthraquinone, 1,4-naphthoquinone, 9,10-phenanthrenequinone, benzo[a]anthracene-7,12-dione, 2,3-naphthacene-5,12-dione, 2-methyl-1,4-naphthoquinone, 1,4-dimethyl anthraquinone, 2,3-dimethyl anthraquinone, 2-phenyl anthraquinone, 2,3-diphenyl anthraquinone, retenquinone, 7,8,9,10-tetrahydronaphthacene-5,12-dione, and 1,2,3,4-tetrahydrobenzo[a]anthracene-7,12-dione.

Other compounds that may be used include those given in U.S. Pat. Nos. 2,850,445, 2,875,047, 3,074,974, 3,097,097, 3,145,104, 3,427,161, 3,479,185, 3,549,367, and 4,162,162.

The photoinitiator content is preferred to be 0.02 to 16 wt %, based on the total amount of the paste.

(C) Glass Powder (Glass Frit)

A glass powder is used as a binder in the present invention to promote sintering of the conductive powder or black pigment components in the black bus electrodes. The glass powder used in the invention is not particularly limited. Powder with sufficiently low softening point to ensure adhesion with the substrate is normally used.

The softening point of the glass powder is normally to be 325 to 700° C., preferably 350 to 650° C., and more preferably 375 to 600° C. If melting takes place at a temperature lower than 325° C., the organic substances will tend to become enveloped, and subsequent degradation of the organic substances will cause blisters to be produced in the paste. A softening point over 700° C., on the other hand, will weaken the paste adhesion and may damage the PDP glass substrate.

Types of glass powder include bismuth-based glass powder, boric acid-based glass powder, phosphorus-based glass powder, Zn—B based glass powder, and lead-based glass powder. The use of lead-free glass powder is preferred in consideration of the burden imposed on the environment.

Glass powder can be prepared by methods well known in the art. For example, the glass component can be prepared by mixing and melting raw materials such as oxides, hydroxides, carbonates etc, making into a cullet by quenching, followed by mechanical pulverization (wet or dry milling). Thereafter, if needed, classification is carried out to the desired particle size.

The specific surface area of the glass powder is preferred to be no more than $10 \text{ m}^2/\text{g}$. At least 90 wt % of the glass powder is preferred to have a particle diameter of 0.4 to 10 μm.

The glass powder content depends on the application of the paste. For insulating purpose, glass powder is typically contained as main component, specifically 15 to 40 wt % based on the total amount of paste. For conductive purpose such as electrode, the content of glass powder is small, specifically 0.5 to 4 wt % based on the total amount of the paste.

(D) Organic Binder

An organic binder is used to allow constituents such as the conductive powder, glass powder, and additive to be dispersed in the paste. The organic binder is burned off.

When the paste of the invention is used to produce a photosensitive paste, the development in an aqueous system is preferred to be taken into consideration in selecting the organic binder. One with high resolution is preferred to be selected.

Examples of organic binders include copolymers or interpolymers prepared from (1) non-acidic comonomers containing $C_1$ to $C_{10}$ alkyl acrylates, $C_1$ to $C_{10}$ alkyl methacrylates, styrene, substituted styrene, or combinations thereof, and (2) acidic comonomers containing ethylenic unsaturated carboxylic acid-containing components. When acidic comonomers are present in the electrode paste, the acidic functional groups will permit development in aqueous bases such as 0.8% sodium carbonate aqueous solution. The acidic comonomer content is preferred to be 15 to 30 wt %, based on the polymer weight.

A lower amount of acidic comonomer may complicate the development of the applied electrode paste on account of aqueous bases while too much acidic comonomer may reduce stability of the paste under a development condition, thereby resulting in only partial development in the areas where images are to be formed.

Suitable acidic comonomers include (1) ethylenic unsaturated monocarboxylic acids such as acrylic acid, methacrylic acid, or crotonic acid; (2) ethylenic unsaturated dicarboxylic acids such as fumaric acid, itaconic acid, citraconic acid, vinylsuccinic acid, and maleic acid; (3) hemiesters of (1) and (2); and (4) anhydrides of (1) and (2). Two or more kinds of acidic comonomers may be used concurrently. Methacrylic polymers are more desirable than acrylic polymers in consideration of the combustibility in low-oxygen atmospheres.

When the non-acidic comonomer is an alkyl acrylate or alkyl methacrylate noted above, the non-acidic comonomer is preferred to be 70 to 75 wt %, based on the polymer weight. When the non-acidic comonomer is styrene or substituted styrene, the non-acidic comonomer is preferred to account for about 50 wt %, based on the polymer weight, and the remaining 50 wt % is preferred to be an acid anhydride such as a hemiester of maleic anhydride. α-methylstyrene is a preferred substituted styrene.

The organic binder can be produced using techniques that are well known in the field of polymers. For example, an acidic comonomer can be mixed with one or more copolymerizable non-acidic comonomers in an organic solvent having a relatively low boiling point (75 to 150° C.) to obtain a 10 to 60% monomer mixture. Polymerization is then brought about by adding a polymerization catalyst to the resulting monomer. The resulting mixture is heated to the reflux temperature of the solvent. When the polymer reaction is substantially completed, the resulting polymer solution is cooled to room temperature to recover a sample.

The molecular weight of the organic binder is not particularly limited, but is preferably less than 50,000, more preferably less than 25,000, and even more preferably less than 15,000.

The organic binder content is preferred to be 5 to 25 wt %, based on the total amount of the paste.

(E) Organic Solvent

The primary purpose for using an organic solvent is to allow the dispersion of solids contained in the paste to be readily applied to the substrate. As such, the organic solvent is preferred to first of all be one that allows the solids to be dispersed while maintaining suitable stability. Secondly, the rheological properties of the organic solvent is preferred to endow the dispersion with favorable application properties.

The organic solvent may be a single component or a mixture of organic solvents. The organic solvent that is selected is preferred to be one in which the polymer and other organic components can be completely dissolved. The organic solvent that is selected is preferred to be inert to the other ingredients in the paste. The organic solvent is preferred to have sufficiently high volatility, and is preferred to be able to evaporate off from the dispersion even when applied at a relatively low temperature in the atmosphere. The solvent is preferred not to be so volatile that the paste on the screen will rapidly dry at ordinary temperature during the printing process.

The boiling point of the organic solvent at ordinary pressure is preferred to be no more than 300° C., and preferably no more than 250° C.

Specific examples of organic solvents include aliphatic alcohols and esters of those alcohols such as acetate esters or propionate esters; terpenes such as turpentine, α- or β-terpineol, or mixtures thereof; ethylene glycol or esters of ethylene glycol such as ethylene glycol monobutyl ether or butyl cellosolve acetate; butyl carbitol or esters of carbitol such as butyl carbitol acetate and carbitol acetate; and Texanol (2,2,4-trimethyl-1,3-pentanediol monoisobutyrate).

The organic solvent content is preferred to be 10 to 40 wt %, based on the total amount of the paste.

(F) Conductive Powder

The conductive powder is optionally added for electric conductivity. Conductive powder gives conductivity to a pattern formed from a paste of the present invention. The conductive particles may scatter irradiated light, causing polymerization to progress in unintended areas. The present invention is therefore particularly useful when the photosensitive paste contains conductive particles.

Such conductive metal includes, but is not limited to, gold, silver, platinum, palladium, copper, aluminum, nickel, or an alloy thereof. The alloy includes, but is not limited to, Ag—Pd alloy, Ag—Pt alloy, Ag—Pt—Pd alloy, Pt—Pd alloy. In terms of cost and effect, the alloy is preferably Ag—Pd alloy, Ag—Pt—Pd alloy or Pt—Pd alloy, and more preferably Ag—Pd alloy. Core-shell type powder also can be used. Examples of the core-shell powder include copper, nickel, aluminum and tungsten coated with silver or gold. The preferred metal powders are selected from the group consisting of gold, silver, palladium, platinum, copper and combinations thereof. The most preferred metal powder is silver. Silver is commonly available and inexpensive. The sintering temperature for silver is relatively low compared with other metal like gold. Furthermore, it is possible to sinter silver metal under the oxygen-containing atmosphere such as air condition.

Virtually any shape metal powder, including spherical powders and flakes (rods, cones, and plates) may be used in the present invention. The preferred shape is a spherical shape because spherical powders have relatively better filling ratio and UV permeability than other shapes.

The conductive powders have an average particle diameter (PSD D50) ranging from 0.1 to 10.0 micrometer. When the average particle diameter (PSD D50) is greater than 10.0 micrometer, the number of defects in the pattern tends to increase. When the average particle diameter (PSD D50) is less than 0.1 micrometer, dispersion and exposure sensitivity of the paste tends to be poor. Here, the mean particle diameter (PSD D50) means the particle diameter corresponding to 50% of the integrated value of the number of particles when the particle size distribution is prepared. The particle size distribution can be determined using a commercially available measuring device such as the X100 by Microtrac.

The content of the conductive powder depends on the application of the paste. For insulating purpose, the content of conductive powder is typically zero. For conductive purpose such as electrode, conductive powder is typically contained as main component, specifically to wt % based on the total amount of the paste.

(G) Additional Components

The paste may also include well-known additional components such as colorant, dispersants, stabilizers, plasticizers, stripping agents, defoamers, and wetting agents.

The second embodiment of the present invention relates to a process for production of pattern, comprising steps of applying a photosensitive paste comprising a polymerizable monomer and a photopolymerization initiator, the glass transition temperature of the polymerizable monomer being −10° C. or less; exposing the applied paste to light, which initiates the polymerization of the polymerizable monomer; developing the exposed paste, thereby forming a pattern; and sintering the pattern.

The second embodiment of the invention will be elaborated in more detail with reference to the figures using an AC PDP manufacturing process as an example.

FIG. 1 illustrates the structure of an AC PDP device with bus electrodes having a two-layer structure. As illustrated in FIG. 1, the front panel of the AC PDP has the following structural elements: glass substrate 5, transparent electrodes 1 formed on the glass substrate 5, black bus electrodes 10 formed on the transparent electrodes 1, and white electrodes 7 formed on the black bus electrodes 10. A dielectric coating layer (transparency overglaze layer) (TOG) 8 and an MgO coating layer 11 are generally formed on the white electrodes 7. The conductive paste of the present invention can be used to produce the while electrode 7.

The rear panel of the AC PDP has the following structural elements: a dielectric substrate 6, discharge spaces 3 filled with ionized gas, second electrodes (address electrodes) 2 parallel to the transparent electrodes 1, and barrier walls 4 dividing the discharge spaces. The transparent electrodes 1 and second electrodes 2 face each other on either side of the discharge spaces 3. The insulating paste of the present invention can be used to produce the barrier walls 4.

The black bus electrodes 10 and white electrodes 7 are formed in the following manner. First, photosensitive black paste is applied on the surface of the substrate and dried. Then, photosensitive while paste is applied on the surface of the black paste. A light, which initiates the polymerization of the polymerizable monomer contained in the black paste and the while paste, is irradiated to the pastes in a prescribed pattern. The polymerization reaction will progress in the parts that have been exposed to light, altering the solubility to the developer. The pattern is developed in basic aqueous solution, and the organic parts are then eliminated through sintering at elevated temperature, whereas the inorganic substances are sintered, thereby forming conductive black bus electrodes 10 and white electrodes 7. The electrode assembly looks black on the surface of the transparent electrodes 1, and the reflection of outside light is suppressed when placed on the front glass substrate.

A method for producing the bus electrodes on the front panel of the PDP is described in detail below.

Figure 2:
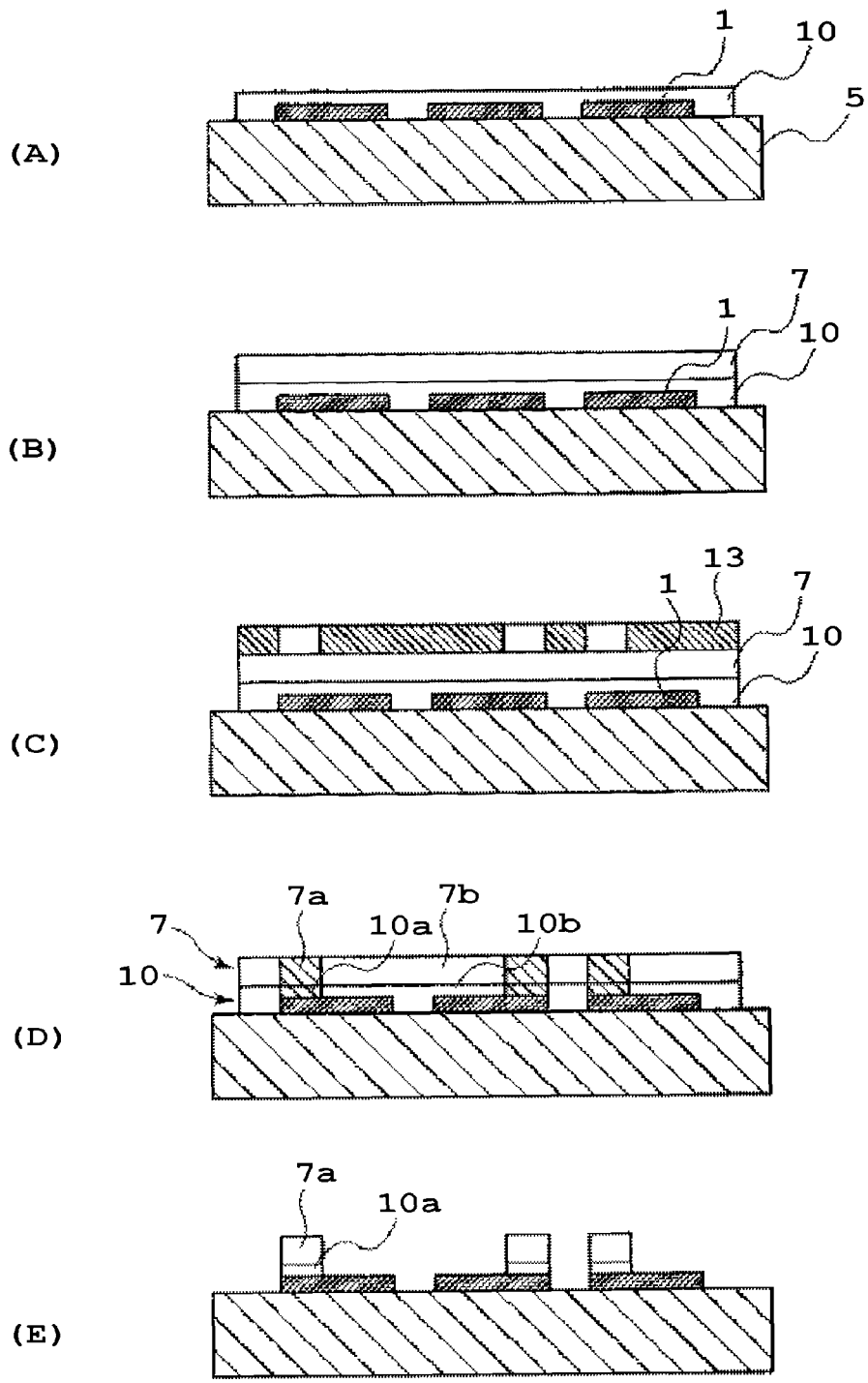
FIG. 2 illustrates a series of processes for producing double-layered bus electrodes on a glass substrate with transparent electrodes, with each figure illustrating (A) the stage where a paste for forming black bus electrodes is applied, (B) the stage where a paste for forming white electrodes is applied, (C) the stage where a given pattern is exposed to light, (D) the development stage, and (E) the sintering stage.

As illustrated in FIG. 2, the method for forming the first electrode comprises a series of processes (FIGS. 2A through 2E).

The transparent electrodes 1 are formed on the glass substrate 5 using $SnO_2$ or ITO in accordance with conventional methods known to those having ordinary skill in the art. The transparent electrodes are usually formed with $SnO_2$ or ITO. They can be formed by ion sputtering, ion plating, chemical vapor deposition, or an electrodeposition technique. Such transparent electrode structures and forming methods are well known in the field of AC PDP technology.

The photosensitive conductive paste of the present invention for black bus electrodes is then used to apply an electrode paste layer 10, and the black electrode paste layer 10 is then dried in nitrogen or the air (FIG. 2A).

A photosensitive conductive paste of the present invention for forming the white electrodes is then applied on the black electrode paste layer 10. The white electrode paste layer 7 is then dried in nitrogen or the air (FIG. 2B). The white electrode paste contains a prescribed low-Tg monomer as described before.

The black electrode paste layer 10 and white electrode paste layer 7 are exposed to light under conditions ensuring the formation of the proper electrode patterns after development. During the exposure to light, the material is usually exposed to UV rays through a target 13 or photo tool having a configuration corresponding to the pattern of the black bus electrodes and white electrodes (FIG. 2C).

The present invention is particularly useful for forming fine patterns. Specifically, the invention is effective for forming patterns in which the shortest pattern intervals are no more than 100 μm, and is particularly effective for forming patterns in which the shortest pattern intervals are no more than 80 μm.

The parts (10a, 7a) of the black electrode paste layer 10 and white electrode paste layer 7 that have been exposed to light are developed in a basic aqueous solution such as 0.4 wt % sodium carbonate aqueous solution or another alkaline aqueous solution. In this process, the parts (10b, 7b) of the layers 10 and 7 that have not been exposed to light are removed. The parts 10a and 7a that have been exposed to light remain (FIG. 2D). The patterns after development are then formed.

The material that has been formed is sintered at a temperature of 450 to 650° C. (FIG. 2E). At this stage, the glass powder melts and becomes firmly attached to the substrate. The sintering temperature is selected according to the substrate material. Sintering at lower temperature is also preferred because sintering at elevated temperatures tends to result in greater diffusion of silver, which is typically used as conductive component of electrode.

The front panel glass substrate assembly produced by the method in FIG. 2 can be used in AC PDP. Returning to FIG. 1, for example, after the transparent electrodes 1, the black bus electrodes 10 and white electrodes 7 have been formed on the front panel glass substrate 5, the front glass substrate assembly is coated with a dielectric layer 8 and then an MgO layer 11. The front panel glass substrate 5 is then combined with a rear panel glass substrate 6.

The conductive paste of the present invention can also be used to form black stripes in a PDP. Attempts to form the black stripes and black bus electrodes with the same paste have been proposed in order to simplify the manufacturing process (such as Japanese Laid-Open Patent Application 2004-063247), and the conductive paste of the invention can be employed in such a process.

EXAMPLES

The invention is illustrated in further detail below by examples. The examples are for illustrative purposes only, and are not intended to limit the invention.

Example

1. Preparation of Photosensitive Conductive Paste

Texanol (2,2,4-trimethyl-1,3-pentanediol monoisobutyrate) as the organic solvent and an acrylic polymer binder having a molecular weight of 6,000 to 7,000 as the organic binder were mixed, and the mixture was heated to 100° C. while stirred. The mixture was heated and stirred until all of the organic binder had dissolved. The resulting solution was cooled to 75° C. EDAB (ethyl 4-dimethyl aminobenzoate), DETX (diethylthioxanthone), and Irgacure 907 by Chiba Specialty Chemicals were added as photoinitiators, and TAOBN (1,4,4-trimethyl-2,3-diazabicyclo[3.2.2]-non-2-ene-N,N-dioxide) was added as a stabilizer. The mixture was stirred at 75° C. until all the solids had dissolved. The solution was filtered through a 20 micron filter and cooled.

A photocurable monomer consisting of etoxylated (15) trimethylolpropane ethoxytriacrylate and polyethylene glycol dimethacrylate, as well as butyrated hydroxytoluene (2,6-di-t-butyl-4-methylphenol, BHT), malonic acid, and BYK085 by BYK as the other organic components, were mixed with the above organic component in a mixing tank under yellow light, so as to prepare a paste. Glass frit and spherical conductive particles of Ag powder were added as the inorganic materials to the mixture of organic components.

The entire paste was mixed until the particles of the inorganic material were wet with the organic material. The mixture was dispersed using a 3-roll mill. The resulting paste was filtered through a 20 μm filter. The viscosity of the paste at this point in time was adjusted with the above Texanol solvent to the ideal viscosity for printing. The components used to prepare the paste and the amounts in which the components were blended are given in Table 1.

TABLE 1

| Component | | content |
|---|---|---|
| Organic solvent | Texanol | 13.7 wt % |
| Organic Binder | acrylic polymer | 7.00 wt % |
| Photopolymerization | EDAB | 0.35 wt % |
| Initiator | DETX | 0.35 wt % |
|  | Irgacure 907 | 0.7 wt % |
| Stabilizer | TAOBN | 0.10 wt % |
| Photopolymerizable Monomer | etoxylated (15) trimethylolpropane triacrylate | 3.00 wt % |
|  | polyethylene glycol dimethacrylate | 2.00 wt % |
| Additive | BHT | 0.20 wt % |
|  | malonic acid | 0.50 wt % |
|  | BYK085 | 0.10 wt % |
| Glass frit |  | 2.0 wt % |
| Conductive powder | Ag powder | 70.0 wt % |
| Total |  | 100 wt % |

2. Preparation of Electrodes

Precautions were taken to avoid dirt contamination, as contamination by dirt during the preparation of the paste and the manufacture of the parts would have resulted in defects.

2-1: Formation of Electrode

The paste was applied on a glass substrate on which transparent electrodes (thin film ITO) had been formed. Screen printing using a 350 mesh screen was used. The paste was then dried for 8 minutes at 100° C. in a hot air circulating furnace, so as to form electrode having a dried film thickness of 6.5 to 7.0 μm.

2-2: UV Ray Pattern Exposure

The layer was exposed to light through a photo tool using a collimated UV radiation source (illumination: 18 to 20 mW/cm$^2$; exposure: 200 mj/cm$^2$).

2-3: Development

An exposed sample was placed on a conveyor and then placed in a spray developing device filled with 0.4 wt % sodium carbonate aqueous solution as the developer. The developer was kept at a temperature of 30° C., and was sprayed at 10 to 20 psi. The sample was developed for 12 seconds. The developed sample was dried by blowing off the excess water with an air jet.

Other Example and Control Example

A paste was prepared and a pattern was formed in the same manner as in the above examples, except that the monomers that were used had been changed as shown in Table 2.

(Evaluation)

The monomer Tg, pattern residue, and transparency after the pattern had been formed were evaluated in the following manner. The results are given in Table 2.

Measurement of Tg of Monomer:

The glass transition point was determined using a differential thermal analyzer DSC6220 manufactured by Shimadzu as the temperature was increased from −100° C. to 200° C. at a rate of 10° C./min.

Residue

The developed silver layer 80 μm line and space portions were observed magnified 100 times using an Olympus BX51 to study the state of the residue.

Transparency

The transparency, as observed from the backside of the glass substrate after development, was mechanically determined. The transparency was measured using a device by Nippon Denshoku Kogyo.

TABLE 2

| Monomer | Tg/□ | Residue | Transparency % |
|---|---|---|---|
| Ethoxylated (30) Bisphenol A dimethacrylate | −40 | Nothing | 66.5 |
| Ethoxylated (15) trimethylolpropane triacrylate | −32 | Nothing | 66.4 |
| Propoxylated (3) trimethylolpropane triacrylate | −15 | Nothing | 66.8 |
| Ethoxylated (6) trimethylolpropane triacrylate | −8 | Residue | 64.5 |
| Ethoxylated (20) trimethylolpropane triacrylate | 38 | Residue | 63.9 |
| Dipropylene glycol diacrylate | 103 | Residue | 63.0 |

As shown in Table 2, when the monomer glass transition point is lower, the transparency is increased, with no residue after development.

What is claimed is:

1. A photosensitive paste, comprising a polymerizable monomer, glass powder, and a photopolymerization initiator, wherein the glass transition temperature of the polymerizable monomer is −10° C. or less, wherein the polymerizable monomer contains 3 to 45 of alkoxy groups per compound on average or 200 to 600 of alkylene repeating units per compound on average, and wherein the content of the polymerizable monomer having the glass transition temperature of −10° C. or less is 50 to 100 wt % based on the total weight of polymerizable monomer in the paste.

2. A photosensitive paste according to claim 1, wherein the content of the polymerizable monomer having the glass transition temperature of −10° C. or less is selected from the group consisting of (a) compounds in which two or more acrylates are linked by an alkoxy group, (b) compounds in which two or more methacrylates are linked by an alkoxy group, (c) compounds in which two or more propane acrylates are linked by an alkoxy group, (d) compounds in which two or more acrylates are linked by a polyalkylene glycol, (e) compound in which two or more methacrylates are linked by a polyalkylene glycol, and (f) compounds in which two or more propane acrylates are linked by a polyalkylene glycol.

3. A photosensitive paste according to claim 1, which comprises conductive powder, glass powder, organic binder and organic solvent, and wherein the photosensitive paste is used for producing an electrode.

4. A photosensitive paste according to claim 1, which comprises glass powder, organic binder and organic solvent, and wherein the photosensitive paste is used for producing insulating pattern.

5. A process for production of a pattern, comprising steps of:
applying a photosensitive paste comprising a polymerizable monomer, glass powder, and a photopolymerization initiator, the glass transition temperature of the polymerizable monomer being −10° C. or less, and wherein the polymerizable monomer contains 3 to 45 of alkoxy groups per compound on average or 200 to 600 of alkylene repeating units per compound on average, and wherein the polymerizable monomer having the glass transition temperature of −10° C. or less is 50 to 100 wt % based on the total weight of polymerizable monomer in the applied paste;
exposing the applied paste to light, which initiates the polymerization of the polymerizable monomer;
developing the exposed paste, thereby forming a pattern; and
sintering the pattern.

6. A process according to claim 5, the content of the polymerizable monomer having the glass transition temperature of −10° C. or less is selected from the group consisting of compounds in which two or more acrylates are linked by an alkoxy group, compounds in which two or more methacrylates are linked by an alkoxy group, compounds in which two or more propane acrylates are linked by an alkoxy group, compounds in which two or more acrylates are linked by a polyalkylene glycol, compound in which two or more methacrylates are linked by a polyalkylene glycol, and compounds in which two or more propane acrylates are linked by a polyalkylene glycol.

7. A process according to claim 5, wherein the applied paste further comprises conductive powder, glass powder, organic binder and organic solvent, and the formed pattern is an electrode.

8. A process according to claim 5, wherein the applied paste further comprises glass powder, organic binder and organic solvent, and the formed pattern is an insulating pattern.

9. A photosensitive paste according to claim 1, wherein the polymerizable monomer contains 3 to 45 of alkoxy groups per compound on average.

10. A photosensitive paste according to claim 1, wherein the polymerizable monomer contains 200 to 600 of alkylene repeating units per compound on average.

11. A process according to claim 5, wherein the polymerizable monomer contains 3 to 45 of alkoxy groups per compound on average.

12. A process according to claim 5, wherein the polymerizable monomer contains 200 to 600 of alkylene repeating units per compound on average.

* * * * *